(12) United States Patent
Oak

(10) Patent No.: US 12,320,840 B2
(45) Date of Patent: Jun. 3, 2025

(54) ELECTRONIC DEVICE RELATED TO DETECTION OF INTERNAL VOLTAGE

(71) Applicant: SK hynix Inc., Icheon-si Gyeonggi-do (KR)

(72) Inventor: Seung Han Oak, Icheon-si Gyeonggi-do (KR)

(73) Assignee: SK hynix Inc., Icheon-si (KR)

( * ) Notice: Subject to any disclaimer, the term of this patent is extended or adjusted under 35 U.S.C. 154(b) by 48 days.

(21) Appl. No.: 18/470,292

(22) Filed: Sep. 19, 2023

(65) Prior Publication Data

US 2024/0418769 A1    Dec. 19, 2024

(30) Foreign Application Priority Data

Jun. 15, 2023    (KR) ........................ 10-2023-0077072

(51) Int. Cl.
*G01R 31/26*    (2020.01)
*G01R 31/28*    (2006.01)

(52) U.S. Cl.
CPC ................................ *G01R 31/2839* (2013.01)

(58) Field of Classification Search
CPC ............ G01R 31/2839; G01R 31/2856; G01R 31/2879
See application file for complete search history.

(56) References Cited

U.S. PATENT DOCUMENTS

| | | | |
|---|---|---|---|
| 10,416,693 B1 * | 9/2019 | Kim | G11C 29/12005 |
| 11,196,437 B1 * | 12/2021 | Draxelmayr | H03M 1/1071 |
| 2003/0098736 A1 | 5/2003 | Uchikoba et al. | |
| 2022/0003813 A1 * | 1/2022 | Moon | G01R 31/2879 |
| 2022/0068417 A1 * | 3/2022 | Chung | G11C 29/14 |
| 2022/0182066 A1 * | 6/2022 | Iriguchi | H03M 1/468 |
| 2022/0375537 A1 * | 11/2022 | Kang | G11C 29/36 |

FOREIGN PATENT DOCUMENTS

KR    1020080063885 A    7/2008

* cited by examiner

*Primary Examiner* — Thang X Le
(74) *Attorney, Agent, or Firm* — WILLIAM PARK & ASSOCIATES LTD.

(57) ABSTRACT

An electronic device includes a test control circuit configured to generate test codes, configured to generate reference voltages voltage levels of which are adjusted responsive to the test codes, and configured to generate a test current the amount of which is adjusted responsive to the reference voltages and an internal voltage detection circuit configured to generate a detection signal for controlling the driving of an internal voltage by detecting the internal voltage responsive to the test current.

20 Claims, 9 Drawing Sheets

ELECTRONIC DEVICE RELATED TO DETECTION OF INTERNAL VOLTAGE

CROSS-REFERENCE TO RELATED APPLICATION

The present application claims priority under 35 U.S.C. § 119(a) to Korean Patent Application No. 10-2023-0077072, filed in the Korean Intellectual Property Office on Jun. 15, 2023, the entire disclosure of which is incorporated herein by reference.

BACKGROUND

The present disclosure relates to an electronic device related to the detection of an internal voltage.

In general, an electronic device, such as a semiconductor device, generates internal voltages necessary for an internal operation by receiving a power supply voltage VDD and a ground voltage VSS from the outside, and uses the generated internal voltages. The voltages necessary for the internal operation of the semiconductor device include a core voltage VCORE that is supplied to the core area of memory, a boosting voltage VPP that is used when a word line is driven or upon overdriving, and a back bias voltage VBB that is supplied as a bulk voltage of an NMOS transistor of the core area.

In this case, the power supply voltage VDD that is received from the outside has only to be lowered to a predetermined level and supplied as the core voltage VCORE. However, the boosting voltage VPP has a higher level than the power supply voltage VDD that is received from the outside, and the back bias voltage VBB maintains a lower level than the ground voltage VSS that is received from the outside. Accordingly, there is a need for a charge pump circuit for supplying charges for the boosting voltage VPP and the back bias voltage VBB.

SUMMARY

In an embodiment, an electronic device may include a test control circuit configured to generate test codes, the test codes being selected or generated or "configured to" generate reference voltages, the magnitudes of which are adjusted based on, i.e., responsive to, test codes. The test control circuit is additionally configured to generate a test current the amount of which is adjusted based on the reference voltages and an internal voltage detection circuit configured to generate a detection signal for controlling the driving of an internal voltage by detecting the internal voltage based on the test current. In an embodiment of the present disclosure, it is preferred that the voltage level of the internal voltage that is detected by the internal voltage detection circuit is adjusted based on the amount of the test current.

In an embodiment, an electronic device may include a test code generation circuit configured to generate a first test code and a second test code when entering a test mode, a reference voltage selection circuit configured to generate a first reference voltage and a second reference voltage the voltage levels of which are adjusted based on the first test code and the second test code, respectively, a test current generation circuit configured to generate a test current the amount of which is adjusted based on the first reference voltage and the second reference voltage, and an internal voltage detection circuit configured to generate a detection signal for an internal voltage by detecting the internal voltage based on the test current.

DETAILED DESCRIPTION

In the descriptions of the following embodiments, the term "preset" indicates that the numerical value of a parameter is previously decided, when the parameter is used in a process or algorithm. According to an embodiment, the numerical value of the parameter may be set when the process or algorithm is started or while the process or algorithm is performed.

Terms such as "first" and "second," which are used to distinguish among various components, are not limited by the components. For example, a first component may be referred to as a second component, and vice versa.

When one component is referred to as being "coupled" or "connected" to another component, it should be understood that the components may be directly coupled or connected to each other or coupled or connected to each other through another component interposed therebetween. In contrast, when one component is referred to as being "directly coupled" or "directly connected" to another component, it should be understood that the components are directly coupled or connected to each other without another component interposed therebetween.

A "logic high level" and a "logic low level" are used to describe the logic levels of signals. A signal having a "logic high level" is distinguished from a signal having a "logic low level." For example, when a signal having a first voltage corresponds to a signal having a "logic high level," a signal having a second voltage may correspond to a signal having a "logic low level." According to an embodiment, a "logic high level" may be set to a voltage higher than a "logic low level." According to an embodiment, the logic levels of signals may be set to different logic levels or opposite logic levels. For example, a signal having a logic high level may be set to have a logic low level in some embodiments, and a signal having a logic low level may be set to have a logic high level in some embodiments.

A "logic bit set" may mean a combination of logic levels of bits included in a signal. When a logic level of each of the bits included in the signal is changed, a logic bit set of the signal may be differently set. For example, if two bits are included in a signal, a logic bit set of the signal may be set as a first logic bit set when logic levels of the two bits included in the signal are a "logic low level" and a "logic low level", and may be set as a second logic bit set when logic levels of the two bits included in the signal are a "logic low level", and a "logic high level."

Hereafter, the present disclosure will be described in more detail through embodiments. The embodiments are only used to exemplify the present disclosure, and the scope of the present disclosure is not limited by the embodiments.

Figure 1:
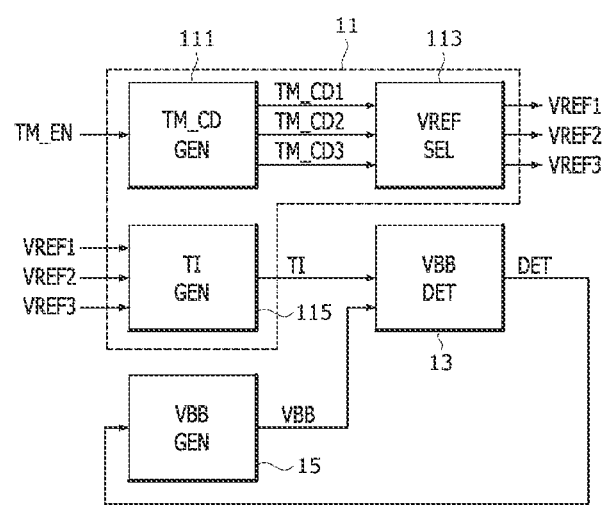
FIG. 1 is a block diagram illustrating a construction of an electronic device according to an example of the present disclosure.

FIG. 1 is a block diagram illustrating an electronic device 1 according to an example of the present disclosure, the electronic device which may include a test control circuit 11, an internal voltage detection circuit (VBB DET) 13, and an internal voltage generation circuit (VBB GEN) 15.

The test control circuit 11 may generate test codes TM_CD1, TM_CD2, and TM_CD3 when the test control circuit enters a test mode. It may also generate reference voltages VREF1, VREF2, and VREF3, the voltage magnitudes of which are adjusted based on, the test codes TM_CD1, TM_CD2, and TM_CD3.

The test control circuit 11 may generate a test current TI the amperage amount of which is determined by and adjusted based on (responsive to) the reference voltages VREF1, VREF2, and VREF3. The test control circuit may supply the test current TI to the internal voltage detection circuit 13.

The test codes TM_CD1, TM_CD2, and TM_CD3 may include a first test code TM_CD1, a second test code TM_CD2, and a third test code TM_CD3. The reference voltages VREF1, VREF2, and VREF3 may include a first reference voltage VREF1, a second reference voltage VREF2, and a third reference voltage VREF3.

The test control circuit 11 may include a test code generation circuit (TM_CD GEN) 111, a reference voltage selection circuit (VREF SEL) 113, and a test current generation circuit (TI GEN) 115.

The test code generation circuit 111 may generate the first test code TM_CD1, the second test code TM_CD2, and the third test code TM_CD3 by receiving a test mode enable signal TM_EN that is generated when entering the test mode. The first test code TM_CD1 may include multiple binary digits, also known as "bits." A values of each bit of a set of bits included in, i.e., comprising, the first test code TM_CD1, may be set to adjust the voltage level of the first reference voltage VREF1. For example, the test code generation circuit 111 may generate the first test code TM_CD1 including bits that have been set as a first logic level (logic zero or logic one) in order to set the voltage level of the first reference voltage VREF1 as a first voltage level and generate the first test code TM_CD1 including bits that have been set as a second logic bit set in order to set the voltage level of the first reference voltage VREF1 as a second voltage level. A set of bits that are included in the second test code TM_CD2 may be set to adjust the voltage level of the second reference voltage VREF2. A set of bits that are included in the third test code TM_CD3 may be set to adjust the voltage level of the third reference voltage VREF3. The test code generation circuit 111 may be connected to the reference voltage selection circuit 113, and may supply the first test code TM_CD1, the second test code TM_CD2, and the third test code TM_CD3 to the reference voltage selection circuit 113.

"Sequentially" is an adverb, which is usually used to describe something arranged in a sequence. "Sequence" usually refers to a set of ordered elements.

When used herein to describe voltages and currents, "sequentially adjusting" should not be construed to mean that different voltage or current levels are set or arranged or fixed in a particular sequence or order such that each voltage successive voltage or current level differs from an adjacent level by the same incremental difference, wherein "increment" refers to an amount by which something changes. "Sequentially adjusting" should be construed instead to include changing or adjusting a voltage or current by one or more steps or increments, the step-sizes of which may be equal or they may be different. A sequentially-adjusted voltage or current may thus change in same-size increments if the steps or increments between levels are fixed and equal. A sequentially-adjusted voltage or current may also change non-linearly if the step size or increments between levels are unequal.

The test code generation circuit 111 may generate the first test code TM_CD1, for sequentially adjusting the voltage level of the first reference voltage VREF1 in the state in which a logic bit set of bits that are included in the second test code TM_CD2 and a logic bit set of bits that are included in the third test code TM_CD3 have been constantly maintained, in the test mode. The first test code TM_CD1 may include bits having a logic bit set which is sequentially adjusted. For example, the test code generation circuit 111 may generate the first test code TM_CD1 for sequentially adjusting the voltage level of the first reference voltage VREF1 from the first voltage level to an N-th voltage level in the state in which the voltage levels of the second reference voltage VREF2 and the third reference voltage VREF3 have been fixed. The first test code TM_CD1 may include bits having a logic bit set which is sequentially adjusted.

The test code generation circuit 111 may generate the second test code TM_CD2 for sequentially adjusting the voltage level of the second reference voltage VREF2 in the state in which a logic bit set of bits that are included in the first test code TM_CD1 and a logic bit set of bits that are included in the third test code TM_CD3 have been constantly maintained, in the test mode. The second test code TM_CD2 may include bits having a logic bit set which is sequentially adjusted. For example, the test code generation circuit 111 may generate the second test code TM_CD2 for sequentially adjusting the voltage level of the second reference voltage VREF2 from the first voltage level to the N-th voltage level in the state in which the voltage levels of the first reference voltage VREF1 and the third reference voltage VREF3 have been fixed. The second test code TM_CD2 may include bits having a logic bit set which is sequentially adjusted.

The test code generation circuit 111 may generate the third test code TM_CD3 for sequentially adjusting the voltage level of the third reference voltage VREF3 in the state in which a logic bit set of bits that are included in the first test code TM_CD1 and a logic bit set of bits that are included in the second test code TM_CD2 have been constantly maintained, in the test mode. The third test code TM_CD3 may include bits having a logic bit set which is sequentially adjusted. For example, the test code generation circuit 111 may generate the third test code TM_CD3 for sequentially adjusting the voltage level of the third reference voltage VREF3 from the first voltage level to the N-th voltage level in the state in which the voltage levels of the first reference voltage VREF1 and the second reference voltage VREF2 have been fixed. The third test code TM_CD3 may include bits having a logic bit set which is sequentially adjusted.

The reference voltage selection circuit 113 may generate the first reference voltage VREF1, the second reference voltage VREF2, and the third reference voltage VREF3 the voltage levels of which are adjusted based on, i.e., responsive to the first test code TM_CD1, the second test code TM_CD2, and the third test code TM_CD3, respectively. The reference voltage selection circuit 113 may generate the first reference voltage VREF1 the voltage level of which is adjusted based on, i.e., responsive to the first test code TM_CD1. The reference voltage selection circuit 113 may generate the second reference voltage VREF2 the voltage level of which is adjusted responsive to the second test code TM_CD2. The reference voltage selection circuit 113 may generate the third reference voltage VREF3 the voltage level of which is adjusted responsive to the third test code TM_CD3.

The reference voltage selection circuit 113 may generate multiple "division voltages" (e.g., VDIV<1:N> in FIG. 2) the voltage magnitudes or levels of which have been differently set through a voltage division operation, which may use a conventional resistive voltage divider network comprised of series-connected resistors, the resistance value of each resistor possibly being equal in one embodiment or different from each other in a different embodiment.

The reference voltage selection circuit 113 may output one division voltage, among multiple division voltages (e.g., VDIV<1:N> in FIG. 2), by selecting the one division voltage as the first reference voltage VREF1 responsive to a logic bit set of bits that are included in the first test code TM_CD1. The reference voltage selection circuit 113 may output one division voltage, among multiple division voltages (e.g., VDIV<1:N> in FIG. 2), by selecting the one division voltage as the second reference voltage VREF2 responsive to a logic bit set of bits that are included in the second test code TM_CD2. The reference voltage selection circuit 113 may output one division voltage, among multiple division voltages (e.g., VDIV<1:N> in FIG. 2), by selecting the one division voltage as the third reference voltage VREF3 responsive to a logic bit set of bits that are included in the third test code TM_CD3. The reference voltage selection circuit 113 may be connected to the test current generation circuit 115, and may supply the first reference voltage VREF1, the second reference voltage VREF2, and the third reference voltage VREF3 to the test current generation circuit 115.

The reference voltage selection circuit 113 may sequentially adjust (incrementally adjust or change by steps) the voltage level of the first reference voltage VREF1 responsive to the first test code TM_CD1 in the state in which the voltage level of the second reference voltage VREF2 has been fixed responsive to the second test code TM_CD2 and the voltage level of the third reference voltage VREF3 has been fixed responsive to the third test code TM_CD3. For example, the reference voltage selection circuit 113 may generate the first reference voltage VREF1 which is sequentially adjusted from the first voltage level to the N-th voltage level in the state in which the voltage levels of the second reference voltage VREF2 and the third reference voltage VREF3 have been fixed.

The reference voltage selection circuit 113 may sequentially adjust the voltage level of the second reference voltage VREF2 responsive to the second test code TM_CD2 in the state in which the voltage level of the first reference voltage VREF1 has been fixed responsive to the first test code TM_CD1 and the voltage level of the third reference voltage VREF3 has been fixed responsive to the third test code TM_CD3. For example, the reference voltage selection circuit 113 may generate the second reference voltage VREF2 which is sequentially adjusted from the first voltage level to the N-th voltage level in the state in which the voltage levels of the first reference voltage VREF1 and the third reference voltage VREF3 have been fixed.

The reference voltage selection circuit 113 may sequentially adjust the voltage level of the third reference voltage VREF3 responsive to the third test code TM_CD3 in the state in which the voltage level of the first reference voltage VREF1 has been fixed responsive to the first test code TM_CD1 and the voltage level of the second reference voltage VREF2 has been fixed responsive to the second test code TM_CD2. For example, the reference voltage selection circuit 113 may generate the third reference voltage VREF3 which is sequentially adjusted from the first voltage level to the N-th voltage level in the state in which the voltage levels of the first reference voltage VREF1 and the second reference voltage VREF2 have been fixed.

The test current generation circuit 115 may generate the test current TI the amount of which is adjusted, responsive to the first reference voltage VREF1, the second reference voltage VREF2, and the third reference voltage VREF3. The test current generation circuit 115 may set the voltage level of a first voltage (e.g., V1 in FIG. 3) responsive to the first reference voltage VREF1. The test current generation circuit 115 may set the amount of a first current (e.g., I1 in FIG. 3) responsive to the second reference voltage VREF2. The test current generation circuit 115 may set the amount of a second current (e.g., I2 in FIG. 3) responsive to the third reference voltage VREF3. The test current generation circuit 115 may generate the test current TI, responsive to a first current (e.g., I1 in FIG. 3) and a second current (e.g., I2 in FIG. 3). The amount of the test current TI may be set as the sum of the amount of a first current (e.g., I1 in FIG. 3) and the amount of a second current (e.g., I2 in FIG. 3).

The internal voltage detection circuit 13 may generate the detection signal DET by determining whether an internal voltage VBB needs to be driven or changed, by detecting the voltage level (i.e., the magnitude) of the internal voltage VBB. The internal voltage detection circuit 13 may generate a detection signal DET that is enabled when the state in which the voltage level of the internal voltage VBB is higher than a target level. The target level may be set at various different voltage levels according to an embodiment. The internal voltage detection circuit 13 may perform a "trimming" voltage level adjustment operation, i.e., adjusting a voltage level by much smaller increments or steps, by adjusting the voltage level of the internal voltage VBB that is detected by receiving the test current TI that is supplied by the test control circuit 11. For example, the internal voltage detection circuit 13 may perform a trimming operation of sequentially adjusting, as −0.61 V, −0.62 V, and −0.63 V, the voltage level of the internal voltage VBB that is detected by the internal voltage detection circuit 13 when the amount of the test current TI that is generated in the test mode is sequentially increased and supplied in the state in which a target level has been set to −0.6 V. The internal voltage detection circuit 13 may be implemented to detect the internal voltage VBB having a lower voltage level when the amount of the test current TI that is supplied by the test control circuit 11 is increased, but this is only an embodiment and the present disclosure is not limited thereto. The internal voltage detection circuit 13 may be connected to the internal voltage generation circuit 15, and may supply the detection signal DET to the internal voltage generation circuit 15.

As used herein, the verb "drive" should be construed to mean, or refer to, setting or forcing or providing a signal that has a particular level or magnitude. By way of example, "driving" a node to three volts means that a node is provided with or forced to have a voltage of 3 volts.

The internal voltage generation circuit 15 may generate the internal voltage VBB in response to the detection signal DET. The internal voltage generation circuit 15 may lower the voltage level of the internal voltage VBB by driving the internal voltage VBB when receiving the detection signal DET that has been enabled. The internal voltage generation circuit 15 may stop the driving of the internal voltage VBB when receiving the detection signal DET that has been disabled.

Figure 2:
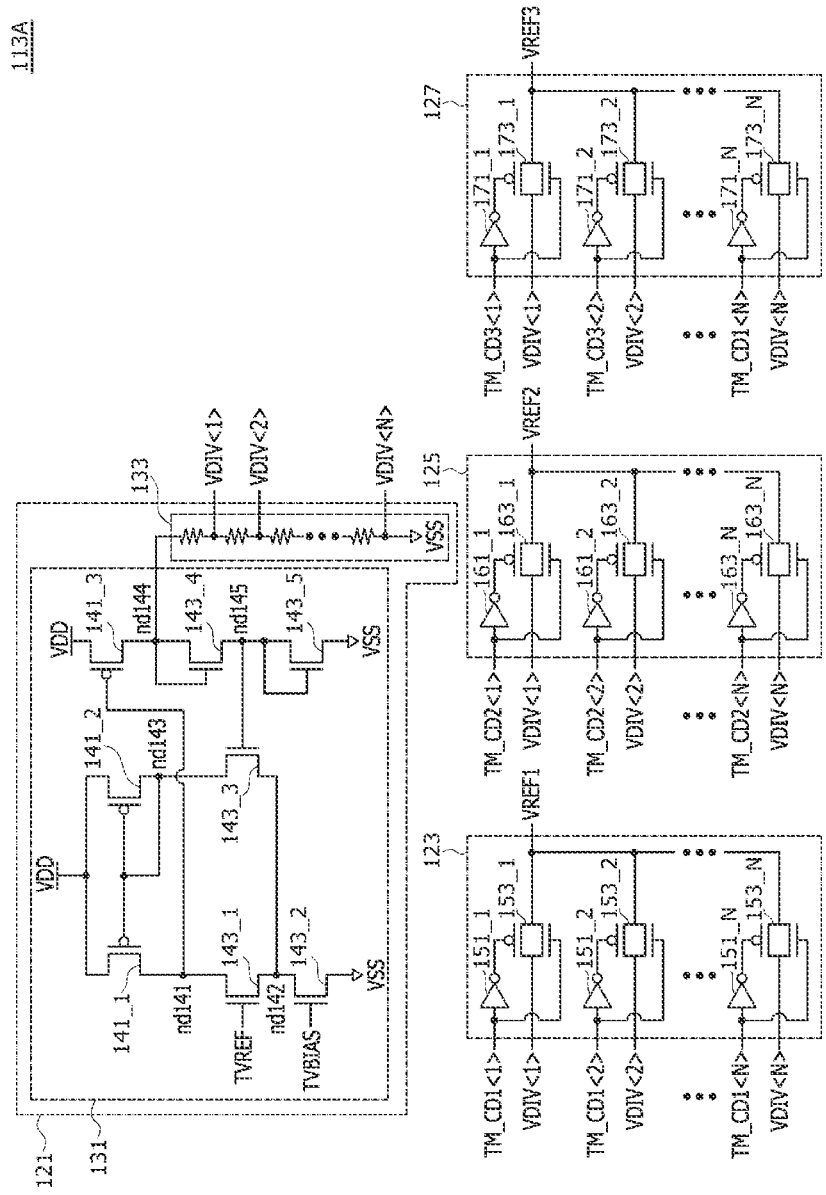
FIG. 2 is a circuit diagram according to an example of a reference voltage selection circuit that is included in the electronic device illustrated in FIG. 1.

FIG. 2 is a circuit diagram of a reference voltage selection circuit 113A according to an example of the reference voltage selection circuit 113. As illustrated in FIG. 2, the reference voltage selection circuit 113A may include a division voltage generation circuit 121, a first reference voltage output circuit 123, a second reference voltage output circuit 125, and a third reference voltage output circuit 127.

The division voltage generation circuit 121 may generate the division voltages VDIV<1:N> having different voltage levels in the test mode. The division voltages VDIV<1:N> may include first to N-th division voltages VDIV<1>, VDIV<2> to VDIV<N>. The first division voltage VDIV<1> may have a first voltage level that has been set as the highest. The second division voltage VDIV<2> may have a second voltage level. The N-th division voltage VDIV<N> may have an N-th voltage level that has been set as the lowest, but this is only an embodiment and the present disclosure is not limited thereto. The division voltage generation circuit 121 may include a comparison driving circuit 131 and a voltage division circuit 133.

The comparison driving circuit 131 may set the voltage level of an internal node nd144 as a preset voltage level, responsive to a test reference voltage TVREF and a test bias TVBIAS. The voltage level of the test reference voltage TVREF may be set as a voltage level that is half the voltage level of the internal node nd144 in the test mode, but this is only an embodiment and the present disclosure is not limited thereto. The voltage level of the test bias TVBIAS may be set as the same level as a preset voltage level in the test mode.

The comparison driving circuit 131 may include PMOS transistors 141_1, 141_2, and 141_3 and NMOS transistors 143_1, 143_2, 143_3, 143_4, and 143_5. The PMOS transistors 141_1 and 141_2 may be connected between a terminal for a power supply voltage VDD and nodes nd141 and nd143, and may operate as constant current sources that supply currents to the nodes nd141 and nd143, respectively. The NMOS transistors 143_1 and 143_2 may be connected between the nodes nd141 and nd143 and a node nd142, and may adjust the amounts of current that are discharged by the nodes nd141 and nd143, respectively, responsive to the results of a comparison between a voltage of a node nd145 and the test reference voltage TVREF.

As used herein and when referring to a field-effect transistor (FET) regardless of whether it is PMOS or NMOS, "turned on" should be construed to mean that the channel is not "pinched off."

When the voltage of the node nd145 has a lower voltage level than the test reference voltage TVREF, the amount of current that is discharged by the NMOS transistor 143_1 becomes greater than the amount of current that is discharged by the NMOS transistor 143_2, so that the node nd141 may be set to have a logic low level. The NMOS transistor 143_2 may be turned on by the test bias TVBIAS in the test mode, and may discharge the current of the node nd142 to a terminal for a ground voltage VSS. The PMOS transistor 141_3 may be turned on by the voltage of the node nd141, and may drive the voltage level of the node nd144 as the voltage level of the power supply voltage VDD. The NMOS transistors 143_4 and 143_5 may each operate as a resistance element, and may divide the voltage level of the node nd144. If the NMOS transistors 143_4 and 143_5 are set to have the same size, resistance values of the NMOS transistors 143_4 and 143_5 are identically set. Accordingly, the voltage level of the node nd145 may be set to be half the voltage level of the node nd144.

The voltage division circuit 133 may include multiple resistance elements that are connected in series between the node nd144 and the terminal for the ground voltage VSS. The voltage division circuit 133 may generate the first to N-th division voltages VDIV<1:N> by dividing the voltage level of the node nd144. Among the first to N-th division voltages VDIV<1:N>, the first division voltage VDIV<1> may be set to have the greatest voltage level, and the N-th division voltage VDIV<N> may be set to have the smallest voltage level. However, this is only an embodiment and the present disclosure is not limited thereto. The structure of the voltage division circuit 133 may be modified in various manners to generate a plurality of division voltages having different voltage levels.

As used herein, a "transfer gate" is an electronic element that will selectively block or pass a signal from an input to an output. Such gates are usually made of a pMOS transistor and nMOS transistor, the control gates of which biased in a complementary manner so that both transistors are either on or off.

The first reference voltage output circuit 123 may output one division voltage, among the first to N-th division voltages VDIV<1:N>, by selecting the one division voltage as the first reference voltage VREF1 responsive to first to N-th bits TM_CD1<1:N> of a first test code. The first reference voltage output circuit 123 may include inverters 151_1, 151_2 to 151_N and transfer gates 153_1, 153_2 to 153_N. The inverters 151_1, 151_2 to 151_N may output the first to N-th bits TM_CD1<1:N> of the first test code, respectively, by inverting and buffering the first to N-th bits TM_CD1<1:N> of the first test code. Each of the transfer gates 153_1, 153_2 to 153_N may be turned on when each of the first to N-th bits TM_CD1<1:N> of the first test code is set to have a logic high level. For example, when the first bit TM_CD1<1> of the first test code has a logic high level and the second to N-th bits TM_CD1<2:N> of the first test code have a logic low level, the transfer gate 153_1 may be turned on. Accordingly, the first reference voltage output circuit 123 may output the first division voltage VDIV<1> by selecting the first division voltage VDIV<1> as the first reference voltage VREF1. As another example, when the N-th bit TM_CD1<N> of the first test code has a logic high level and the first to (N-1)-th bits TM_CD1<1:N-1> of the first test code have a logic low level, the transfer gate 153_N may be turned on. Accordingly, the first reference voltage output circuit 123 may output the N-th division voltage VDIV<N> by selecting the N-th division voltage VDIV<N> as the first reference voltage VREF1.

The second reference voltage output circuit 125 may output one division voltage, among the first to N-th division voltages VDIV<1:N>, by selecting the one division voltage as the second reference voltage VREF2 responsive to first to N-th bits TM_CD2<1:N> of a second test code. The second reference voltage output circuit 125 may include inverters 161_1, 161_2 to 161_N and transfer gates 163_1, 163_2 to 163_N. The inverters 161_1, 161_2 to 161_N may output the first to N-th bits TM_CD2<1:N> of the second test code, respectively, by inverting and buffering the first to N-th bits TM_CD2<1:N> of the second test code. Each of the transfer gates 163_1, 163_2 to 163_N may be turned on when each of the first to N-th bits TM_CD2<1:N> of the second test code is set to have a logic high level. For example, when the first bit TM_CD2<1> of the second test code has a logic high level and the second to N-th bits TM_CD2<2:N> of the second test code have a logic low level, the transfer gate 163_1 may be turned on. Accordingly, the second reference voltage output circuit 125 may output the first division voltage VDIV<1> by selecting the first division voltage VDIV<1> as the second reference voltage VREF2. As another example, when the N-th bit TM_CD2<N> of the second test code has a logic high level and the first to (N-1)-th bits TM_CD2<1: N-1> of the second test code have a logic low level, the transfer gate 163_N may be turned on. Accordingly, the second reference voltage output circuit 125 may output the N-th division voltage VDIV<N> by selecting the N-th division voltage VDIV<N> as the second reference voltage VREF2.

The third reference voltage output circuit 127 may output one division voltage, among the first to N-th division voltages VDIV<1:N>, by selecting the one division voltage as the third reference voltage VREF3 responsive to first to N-th bits TM_CD3<1:N> of a third test code. The third reference voltage output circuit 127 may include inverters 171_1, 171_2 to 171_N and transfer gates 173_1, 173_2 to 173_N. The inverters 171_1, 171_2 to 171_N may output the first to N-th bits TM_CD3<1:N> of the third test code, respectively, by inverting and buffering the first to N-th bits TM_CD3<1: N>. Each of the transfer gates 173_1, 173_2 to 173_N may be turned on when each of the first to N-th bits TM_CD3<1: N> of the third test code is set to have a logic high level. For example, when the first bit TM_CD3<1> of the third test code has a logic high level and the second to N-th bits TM_CD3<2:N> of the third test code have a logic low level, the transfer gate 173_1 may be turned on. Accordingly, the third reference voltage output circuit 127 may output the first division voltage VDIV<1> by selecting the first division voltage VDIV<1> as the third reference voltage VREF3. As another example, when the N-th bit TM_CD3<N> of the third test code has a logic high level and the first to (N-1)-th bits TM_CD3<1:N-1> of the third test code have a logic low level, the transfer gate 173_N may be turned on. Accordingly, the third reference voltage output circuit 127 may output the N-th division voltage VDIV<N> by selecting the N-th division voltage VDIV<N> as the third reference voltage VREF3.

Figure 3:
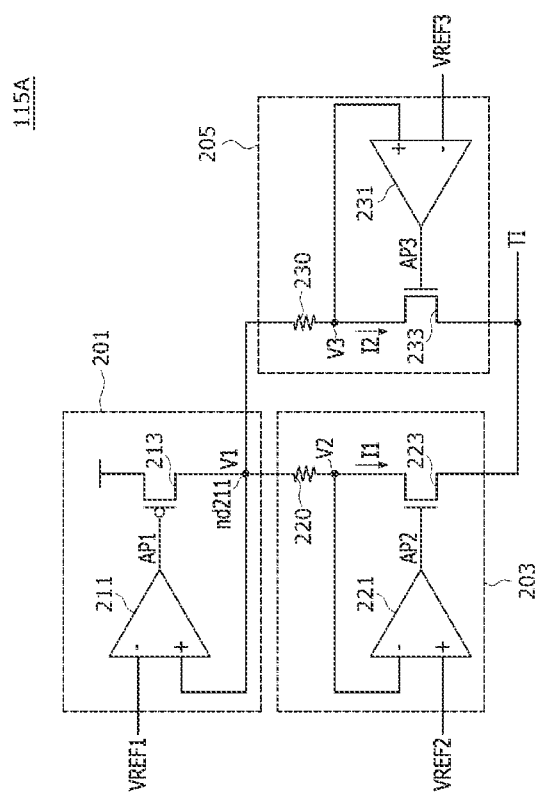
FIG. 3 is a circuit diagram according to an example of a test current generation circuit that is included in the electronic device illustrated in FIG. 1.

FIG. 3 is a circuit diagram of a test current generation circuit 115A according to an example of the test current generation circuit 115. As illustrated in FIG. 3, the test current generation circuit 115A may include a voltage setting circuit 201, a first current setting circuit 203, and a second current setting circuit 205.

As used herein, a comparator is an electronic device that compares two input voltages and outputs a binary signal, a signal, which when output from the device may be only one of two different values, a particular output signal indicating which of the input signals is larger. In most comparator embodiments, if the non-inverting (+) input is greater than the inverting (−) input, the output goes high. If the inverting input is greater than the non-inverting, the output goes low.

The voltage setting circuit 201 may set the first voltage V1 responsive to the first reference voltage VREF1. The voltage setting circuit 201 may adjust the voltage level of the first voltage V1 by comparing the first reference voltage VREF1 and the first voltage V1. The voltage setting circuit 201 may include a first comparator 211 and a PMOS transistor 213. The first comparator 211 may generate a first comparison signal AP1 by comparing the first voltage V1 and the first reference voltage VREF1. The first comparator 211 may generate the first comparison signal AP1 that is set to a logic low level when the first voltage V1 has a lower voltage level than the first reference voltage VREF1. The PMOS transistor 213 may be turned on when receiving the first comparison signal AP1 that is set to have a logic low level because the voltage level of the first voltage V1 is lower than the voltage level of the first reference voltage VREF1, and may drive the first voltage V1 that is output by the node nd211. The voltage setting circuit 201 may be implemented to set the voltage level of the first voltage V1 to be a higher voltage level as the voltage level of the first reference voltage VREF1 is increased, but this is only an embodiment and the present disclosure is not limited thereto.

The first current setting circuit 203 may set the first current I1 responsive to a second reference voltage VREF2. The first current setting circuit 203 may include a first resistance element 220, a second comparator 221, and an NMOS transistor 223. The second comparator 221 may generate a second comparison signal AP2 by comparing the second reference voltage VREF2 and a second voltage V2. The second comparator 221 may generate the second comparison signal AP2 that is set to have a logic high level when the second voltage V2 has a lower voltage level than the second reference voltage VREF2. The NMOS transistor 223 may be turned on when receiving the second comparison signal AP2 that is set to have a logic high level when the voltage level of the second voltage V2 is lower than the voltage level of the second reference voltage VREF2, and may transfer the first current I1 as the test current TI. The first current setting circuit 203 may be implemented to set the voltage level of the second voltage V2 to be a higher voltage level and to set the amount of the first current I1 to be greater as the voltage level of the second reference voltage VREF2 is increased, but this is only an embodiment and the present disclosure is not limited thereto.

The second current setting circuit 205 may set the second current I2 responsive to the third reference voltage VREF3. The second current setting circuit 205 may include a second resistance element 230, a third comparator 231, and an NMOS transistor 233.

The third comparator 231 may generate a third comparison signal AP3 by comparing the third reference voltage VREF3 and a third voltage V3. The third comparator 231 may generate the third comparison signal AP3 that is set to have a logic high level when the third voltage V3 to be a higher voltage level than the third reference voltage VREF3. The NMOS transistor 233 may be turned on when receiving the third comparison signal AP3 that is set to have a logic high level when the voltage level of the third voltage V3 is higher than the voltage level of the third reference voltage VREF3, and may transfer the second current I2 as the test current TI. The second current setting circuit 205 may be implemented to set the voltage level of the third voltage V3 to be a higher voltage level and to set the amount of the second current I2 to be greater as the voltage level of the second reference voltage VREF2 is lowered, but this is only an embodiment and the present disclosure is not limited thereto.

Figure 4:
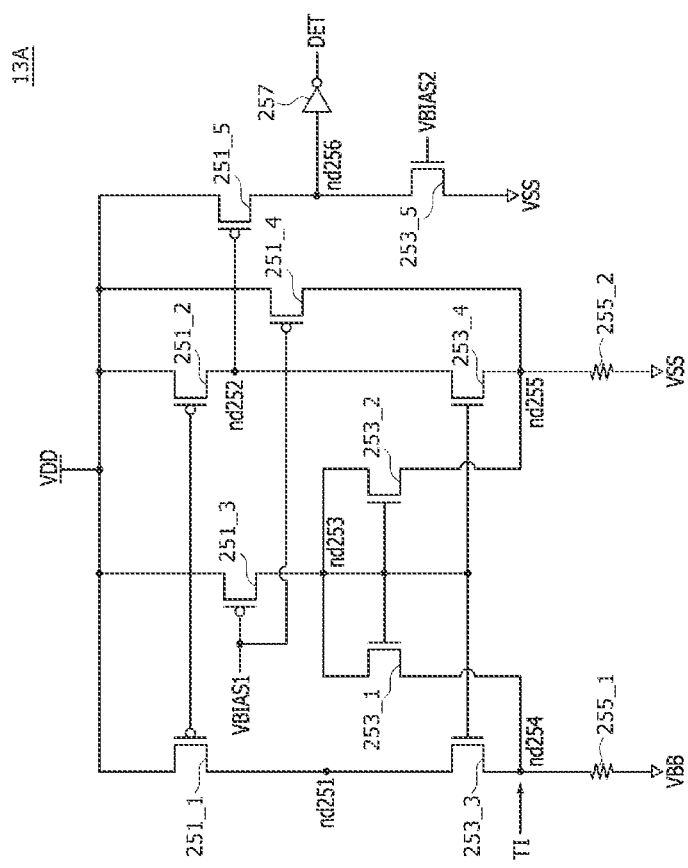
FIG. 4 is a circuit diagram according to an example of an internal voltage detection circuit that is included in the electronic device illustrated in FIG. 1.

FIG. 4 is a circuit diagram of an internal voltage detection circuit 13A according to an example of the internal voltage detection circuit 13. As illustrated in FIG. 4, the internal voltage detection circuit 13A may include PMOS transistors 251_1, 251_2, 251_3, 251_4, and 251_5, NMOS transistors 253_1, 253_2, 253_3, 253_4, and 253_5, resistance elements 255_1 and 255_2, and an inverter 257. The PMOS transistors 251_1 and 251_2 may operate as constant current sources that supply currents to nodes nd251 and nd252, respectively. The PMOS transistors 251_3 and 251_4 may be turned on by a first bias voltage VBIAS1, and may operate as constant current sources that supply currents to nodes nd253 and nd255, respectively. The degrees of turn-on of the NMOS transistors 253_1, 253_2, 253_3, and 253_4 may be determined responsive to voltages of the nodes nd251, nd252, nd253, nd254, and nd255. Voltages of the nodes nd254 and nd255 may be identically set by the NMOS transistors 253_1, 253_2, 253_3, and 253_4.

The PMOS transistor 251_5 may be turned on responsive to the voltage level of the node nd252, and may pull-up drive a node nd256 to the voltage level of the power supply voltage VDD. The NMOS transistor 253_5 may be turned on by a second bias voltage VBIAS2, and may pull-down drive the node nd256 to the voltage level of the ground voltage VSS. The resistance element 255_1 may be connected between the node nd254 and a terminal for the internal voltage VBB. The inverter 257 may output the detection signal DET by inverting and buffering the signal of the node nd254. The node nd254 may be supplied with the test current TI that is supplied by the test current generation circuit 115. The resistance element 255_2 may be connected between the node nd255 and the terminal for the ground voltage VSS. The voltage level of the internal voltage VBB that is detected by the amount of the test current TI that is supplied when the test current TI is supplied through the node nd254 may be reduced in the state in which voltages of the nodes nd254 and nd255 have been set to have the same voltage level. In the test mode, when the amount of the test current TI is sequentially changed and supplied, the internal voltage detection circuit 13A may perform a trimming operation of sequentially adjusting the voltage level of the internal voltage VBB that is detected.

Figure 5:
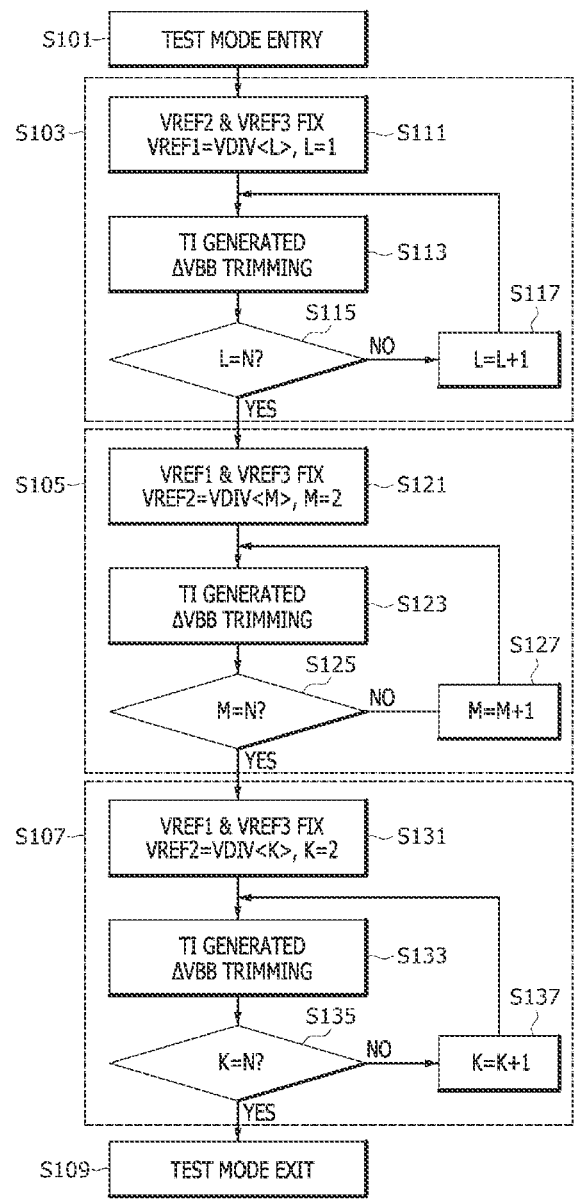
FIG. 5 is a flowchart for describing an operation of a test mode for adjusting the voltage level of an internal voltage that is detected in the electronic device illustrated in FIG. 1, being performed.

FIG. 5 is a flowchart for describing an operation in the test mode for adjusting the voltage level of the internal voltage VBB that is detected in the electronic device 1, being performed. FIGS. 6 to 9 are diagrams for illustrating an operation in the test mode being performed.

As illustrated in FIG. 5, an operation in the test mode, which is performed in order to adjust a detected voltage level of the internal voltage VBB may be performed in order in which an operation S101 of the test mode being entered, a first trimming operation S103, a second trimming operation S105, a third trimming operation S107, and an operation S109 of exiting from the test mode are sequentially performed. The first trimming operation S103, the second trimming operation S105, and the third trimming operation S107 are described in detail as follows with reference to FIGS. 5 to 9.

Figure 6:
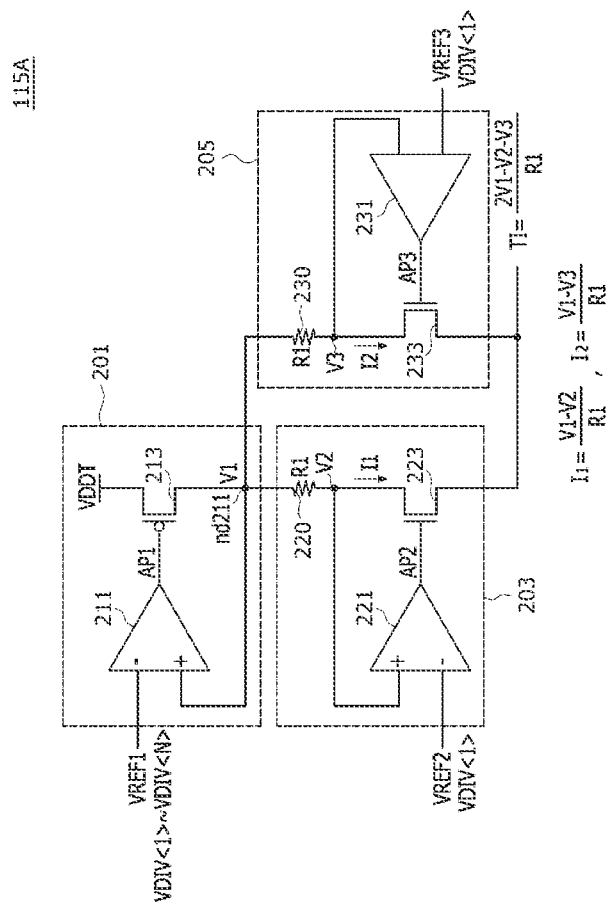
FIGS. 6 to 9 are diagrams for illustrating an operation in the test mode being performed.

As illustrated in FIGS. 5 and 6, the first trimming operation S103 may be performed in the way that the test current TI is generated while the voltage level of the first reference voltage VREF1 is sequentially changed from the first division voltage VDIV<1> to the N-th division voltage VDIV<N> in the state in which the voltage level of the second reference voltage VREF2 has been fixed as the first division voltage VDIV<1> and the voltage level of the third reference voltage VREF3 has been fixed as the first division voltage VDIV<1> and the voltage level of the internal voltage VBB that is detected by the internal voltage detection circuit 13A is sequentially adjusted responsive to the test current TI (S111 to S117). More specifically, the first trimming operation S103 may be performed in the way that an operation of generating the test current TI by setting (S111) the voltage level of the first reference voltage VREF1 as the first division voltage VDIV<1> in the state in which the voltage level of the second reference voltage VREF2 has been fixed as the first division voltage VDIV<1> and the voltage level of the third reference voltage VREF3 has been fixed as the first division voltage VDIV<1>, adjusting (S113) the voltage level of the internal voltage VBB that is detected by the internal voltage detection circuit 13A responsive to the test current TI, and then adjusting (S113) the voltage level of the internal voltage VBB that is detected while the voltage level of the first reference voltage VREF1 is sequentially changed from the second division voltage VDIV<2> to the N-th division voltage VDIV<N> through operations S115 and S117, is repeated. The amount of the test current TI, which is generated at this time, may be adjusted by the first voltage V1, the second voltage V2, and the third voltage V3 that are set by the first reference voltage VREF1, the second reference voltage VREF2, and the third reference voltage VREF3 when the resistance elements 220 and 230 are identically set to have a resistance value R1. That is, the test current TI may be generated as $$\frac{2V1 - V2 - V3}{R1}$$

because the first current I1 is generated as $$\frac{V1 - V2}{R1},$$

the second current I2 is generated as $$\frac{V1 - V3}{R1},$$

and TI=I1+I2.

Figure 7:
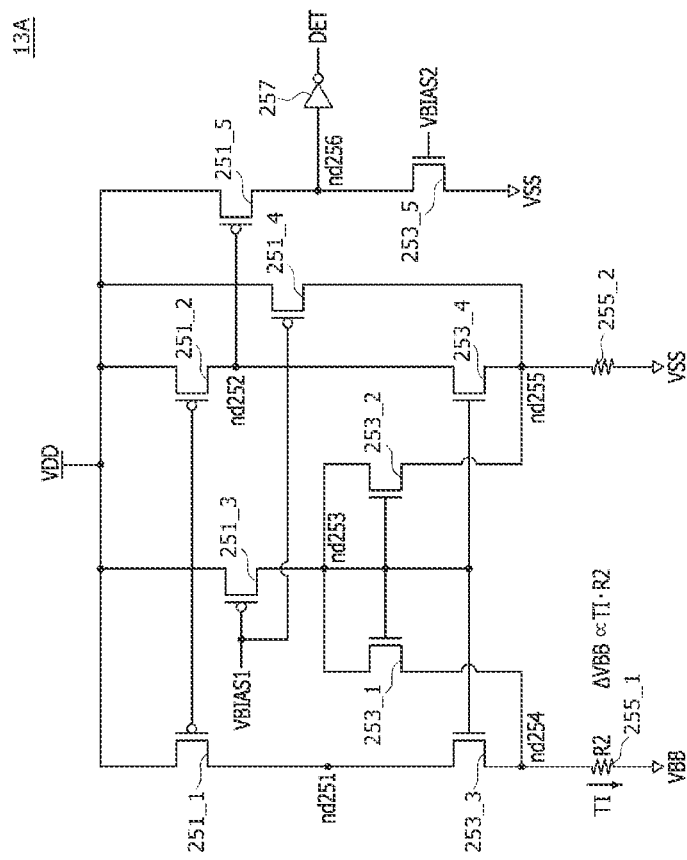

As illustrated in FIGS. 5 and 7, when the test current TI is supplied to the node nd254 of the internal voltage detection circuit 13A, a voltage drops by a resistance value R2 of the resistance element 255_1. Accordingly, a change in the voltage level of the internal voltage VBB that is detected by the internal voltage detection circuit 13A, is proportional to the voltage level of the voltage that drops through the resistance element 255_1, that is, the product of the test current TI and the resistance value R2 of the resistance element 255_1. The first trimming operation S103 of sequentially adjusting the voltage level of the internal voltage VBB that is detected by the internal voltage detection circuit 13A, may be performed responsive to the test current TI the amount of which is sequentially changed when the voltage level of the first reference voltage VREF1 is sequentially changed from the first division voltage VDIV<1> to the N-th division voltage VDIV<N>.

Figure 8:
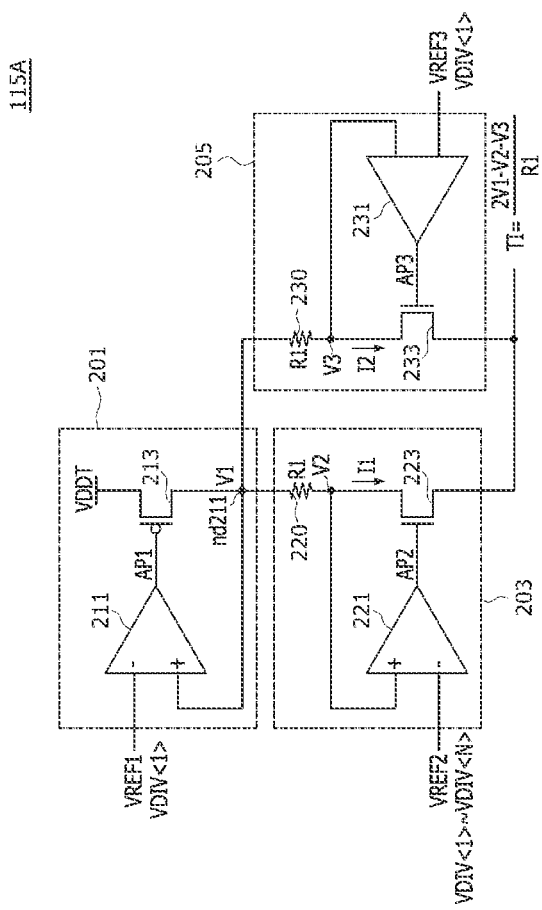

As illustrated in FIGS. 5 and 8, the second trimming operation S105 may be performed in the way that the test current TI is generated while the voltage level of the second reference voltage VREF2 is sequentially changed from the second division voltage VDIV<2> to the N-th division voltage VDIV<N> in the state in which the voltage level of the first reference voltage VREF1 has been fixed as the first division voltage VDIV<1> and the voltage level of the third reference voltage VREF3 has been fixed as the first division voltage VDIV<1> and the voltage level of the internal voltage VBB that is detected by the internal voltage detection circuit 13A is sequentially adjusted responsive to the test current TI (S121 to S127). More specifically, the second trimming operation S105 may be performed in the way that an operation of generating the test current TI by setting (S121) the voltage level of the second reference voltage VREF2 as the second division voltage VDIV<2> in the state in which the voltage level of the first reference voltage VREF1 has been fixed as the first division voltage VDIV<1> and the voltage level of the third reference voltage VREF3 has been fixed as the first division voltage VDIV<1>, adjusting (S123) the voltage level of the internal voltage VBB that is detected by the internal voltage detection circuit 13A, responsive to the test current TI, and then adjusting (S123) the voltage level of the internal voltage VBB that is detected while the voltage level of the second reference voltage VREF2 is sequentially changed from the third division voltage VDIV<3> to the N-th division voltage VDIV<N> through operations S125 and S127, is repeated. The test current TI that is generated at this time may be generated as $$\frac{2V1 - V2 - V3}{R1}.$$

Figure 9:
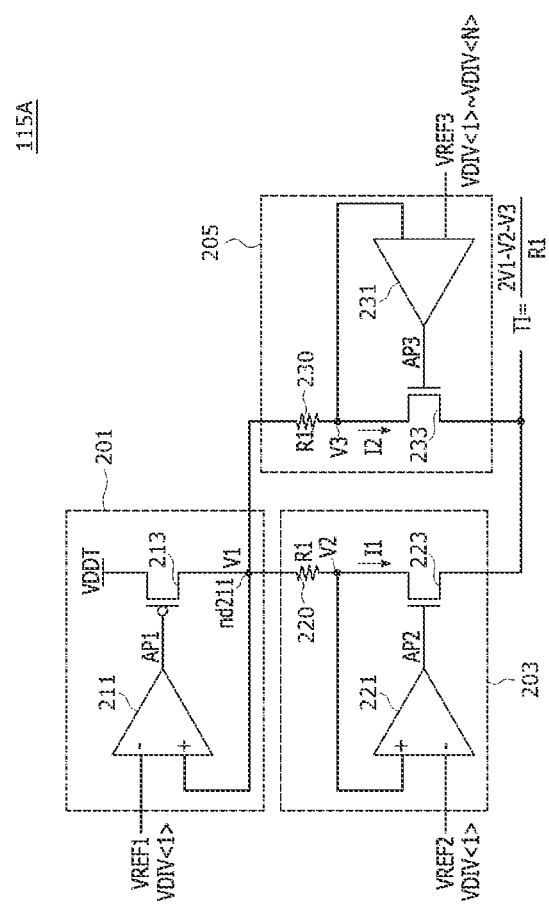

As illustrated in FIGS. 5 and 9, the third trimming operation S107 may be performed in the way that the test current TI is generated while the voltage level of the third reference voltage VREF3 is sequentially changed from the second division voltage VDIV<2> to the N-th division voltage VDIV<N> in the state in which the voltage level of the first reference voltage VREF1 has been fixed as the first division voltage VDIV<1> and the voltage level of the second reference voltage VREF2 has been fixed as the first division voltage VDIV<1> and the voltage level of the internal voltage VBB that is detected by the internal voltage detection circuit 13A is sequentially adjusted responsive to the test current TI (S131 to S137). More specifically, the third trimming operation S107 may be performed in the way that an operation of generating (S131) the test current TI by setting the voltage level of the third reference voltage VREF3 as the second division voltage VDIV<2> in the state in which the voltage level of the first reference voltage VREF1 has been fixed as the first division voltage VDIV<1>and the voltage level of the second reference voltage VREF2 has been fixed as the first division voltage VDIV<1>, adjusting (S133) the voltage level of the internal voltage VBB that is detected by the internal voltage detection circuit 13A, responsive to the test current TI, and then adjusting (S133) the voltage level of the internal voltage VBB that is detected while the voltage level of the third reference voltage VREF3 is sequentially changed from the third division voltage VDIV<3> to the N-th division voltage VDIV<N> through operations S135 and S137, is repeated. The test current TI that is generated at this time may be set and generated as $$\frac{2V1 - V2 - V3}{R1}.$$

The aforementioned electronic device 1 can easily adjust the voltage level of the internal voltage VBB that is detected by the internal voltage detection circuit 13, by generating the reference voltages VREF1, VREF2, and VREF3 the voltage level of each of which may be adjusted as various voltage levels and supplying the internal voltage detection circuit 13 with the test current TI the amount of which is adjusted responsive to the reference voltages VREF1, VREF2, and VREF3. Furthermore, the electronic device 1 can also adjust a voltage level at which the internal voltage VBB is trimmed at intervals of a desired voltage level without adding a special circuit, by adjusting the voltage level of the internal voltage VBB that is detected by the internal voltage detection circuit 13, by adjusting the amount of the test current TI. The electronic device 1 has been described as generating the internal voltage VBB, but may be applied to generate various internal voltages, such as various core voltages VCORE and various boosting voltages VPP, according to an embodiment.

The embodiments of the present disclosure have been described so far. A person having ordinary knowledge in the art to which the present invention pertains will understand that the present invention may be implemented in a modified form without departing from an intrinsic characteristic of the present disclosure. Accordingly, the disclosed embodiments should be considered from a descriptive viewpoint, not from a limitative viewpoint. The range of the present disclosure is described in the claims not the aforementioned description, and all differences within an equivalent range thereof should be construed as being included in the present disclosure.

What is claimed is:

1. An electronic device comprising:
   a test control circuit configured to generate test codes, each of the test codes comprising a plurality of binary digits, configured to generate a corresponding reference voltage based on the plurality of binary digits of the test code, and configured to generate a test current based on the corresponding reference voltage; and
   an internal voltage detection circuit configured to generate a detection signal that controls an internal voltage based on the test current,
   wherein a voltage level of the internal voltage detected by the internal voltage detection circuit is adjusted responsive to the test current.

2. The electronic device of claim 1, wherein the test control circuit is configured to receive a test mode enable signal and to generate a test code when the test control circuit enters a test mode.

3. The electronic device of claim 1, wherein:
   the test codes comprise a first test code and a second test code,
   the reference voltages comprise a first reference voltage and a second reference voltage, and
   the test control circuit comprises a test code generation circuit configured to generate the first test code comprising binary digits, at least one binary digit having a value corresponding to the first reference voltage and configured to generate the second test code comprising binary digits, at least one binary digit having a value used to adjust the second reference voltage.

4. The electronic device of claim 3, wherein the test code generation circuit is configured to sequentially adjust the binary digits of the first test code to binary digits maintained in the second test code.

5. The electronic device of claim 4, wherein the test code generation circuit is configured to sequentially adjust binary digits of the second test code to maintain the first test code.

6. The electronic device of claim 1, wherein:
   the test codes comprise a first test code and a second test code, the reference voltages comprise a first reference voltage and a second reference voltage, and the test control circuit comprises a reference voltage selection circuit configured to adjust a voltage level of the first reference voltage in response to receiving the first test code and configured to adjust a voltage level of the second reference voltage in response to receiving the second test code.

7. The electronic device of claim 6, wherein the reference voltage selection circuit is configured to sequentially adjust the voltage level of the first reference voltage corresponding to the first test code when the voltage level of the second reference voltage is constant.

8. The electronic device of claim 7, wherein the reference voltage selection circuit is configured to adjust the voltage level of the second reference voltage corresponding to the second test code when the voltage level of the first reference voltage is constant.

9. The electronic device of claim 6, wherein the reference voltage selection circuit comprises:
a voltage division circuit configured to provide different division voltages by dividing a voltage of an internal node;
a first reference voltage output circuit configured to output first division voltage by selecting the first division voltage as the first reference voltage responsive to the first test code; and
a second reference voltage output circuit configured to output a second division voltage by selecting the second division voltage as the second reference voltage responsive to the second test code.

10. The electronic device of claim 1, wherein:
the reference voltages comprise a first reference voltage, a second reference voltage, and a third reference voltage, and
the test control circuit comprises a test current generation circuit configured to generate a test current corresponding to each of the first reference voltage, the second reference voltage, and the third reference voltage.

11. The electronic device of claim 10, wherein the test current generation circuit further comprises:
a voltage setting circuit configured to set a first voltage responsive to the first reference voltage;
a first current setting circuit configured to adjust, responsive to the second reference voltage, a first current that flows through a first resistance element connected to an internal node at the first voltage; and
a second current setting circuit configured to adjust, responsive to the third reference voltage, a second current that flows through a second resistance element that is connected to the internal node.

12. The electronic device of claim 11, wherein the test current generation circuit is configured to generate the test current to be an amount of current that is a sum of the amount of the first current and the amount of the second current.

13. The electronic device of claim 11, wherein the voltage setting circuit comprises:

a comparator configured to generate a comparison signal by comparing a voltage of the internal node and the first reference voltage; and
a MOS transistor configured to be conductive responsive to the comparison signal and configured to set the first voltage.

14. The electronic device of claim 11, wherein the first current setting circuit comprises:
a comparator configured to generate a comparison signal by comparing a second voltage based on the first current, to the second reference voltage; and
a MOS transistor turned on responsive to the comparison signal and configured to adjust the first current.

15. The electronic device of claim 11, wherein the second current setting circuit comprises:
a comparator configured to generate a comparison signal by comparing a third voltage set responsive to the second current and the third reference voltage; and
a MOS transistor turned on responsive to the comparison signal and configured to adjust the amount of the current of the second current.

16. An electronic device comprising:
a test code generation circuit configured to generate a first test code and a second test code when entering a test mode;
a reference voltage selection circuit configured to generate a first reference voltage and a second reference voltage adjusted responsive to the first test code and the second test code, respectively;
a test current generation circuit configured to generate a test current adjusted responsive to the first reference voltage and the second reference voltage; and
an internal voltage detection circuit configured to generate a detection signal that controls an internal voltage responsive to the test current.

17. The electronic device of claim 16, wherein a voltage level of the internal voltage detected by the internal voltage detection circuit is adjusted responsive to the test current.

18. The electronic device of claim 16, wherein the test code generation circuit is configured to
adjust binary digits in the first test code; and
adjust binary digits in the second test code.

19. The electronic device of claim 16, wherein the reference voltage selection circuit is configured to
adjust a voltage level of the first reference voltage corresponding to a first test code by which when a voltage level of the second reference voltage is constant; and
adjust a voltage level of the second reference voltage corresponding to a second test code when the first reference voltage is constant.

20. The electronic device of claim 16, wherein the test current generation circuit comprises:
a voltage setting circuit configured to set a first voltage responsive to the first reference voltage; and
a current setting circuit configured to adjust, responsive to the second reference voltage, a first current through a first resistance element connected to an internal node at the first voltage.

* * * * *